United States Patent [19]

Snowden et al.

[11] Patent Number: 4,771,399

[45] Date of Patent: Sep. 13, 1988

[54] METHOD AND APPARATUS FOR PROGRAMMING MEMORY THROUGH BATTERY TERMINALS

[75] Inventors: Gregory O. Snowden, Boca Raton; Joseph V. Ranalletta, Coral Springs, both of Fla.

[73] Assignee: Motorola, Inc., Schaumburg, Ill.

[21] Appl. No.: 815,472

[22] Filed: Dec. 31, 1985

[51] Int. Cl.$^4$ .............................................. G06F 13/00
[52] U.S. Cl. .................................. 364/900; 455/186; 340/825.44; 364/200
[58] Field of Search ... 364/200 MS File, 900 MS File, 364/550; 365/228, 229, 184; 379/57; 323/909; 340/825.44, 825.52; 455/33, 53, 86

[56] References Cited

U.S. PATENT DOCUMENTS

| 3,562,729 | 2/1971 | Hurd III | 323/909 |
| 3,644,681 | 2/1972 | Rice | 179/41 A |
| 4,122,532 | 10/1978 | Dlugos et al. | 364/900 |
| 4,332,981 | 6/1982 | Palombi et al. | 179/2 EA |
| 4,422,071 | 12/1983 | de Graaf | 340/825 |
| 4,525,865 | 6/1985 | Mears | 455/186 |
| 4,593,155 | 6/1986 | Hawkins | 179/2 EA |

FOREIGN PATENT DOCUMENTS 0148458 12/1984 European Pat. Off. .

OTHER PUBLICATIONS

Giles, O. S., "E$^2$PROM Technology Triggers New Generation of Radios," Mobile Radio Technology, May, 1983.
GE TQ-2310 Universal Radio Programmer manual.
Midland "SYN-TECH" Mobile Radio catalog sheet, published 1982.
Motorola MCmicro Mobile Radio and Base Station catalog sheet No. R-40, Sec 1.1, Item 113, published Apr. 1985.
Motorola "SENSAR" series display radio pager service manual, No. 68P81038C65-0, printed May 1985.
Wilson "Citi-Com Plus" catalog sheet.

*Primary Examiner*—Gareth D. Shaw
*Assistant Examiner*—Lester G. Kincaid
*Attorney, Agent, or Firm*—Douglas A. Boehm; Charles L. Warren; Anthony J. Sarli, Jr.

[57] ABSTRACT

A memory programming system which provides a method and apparatus for programming and reading an electronic device memory through its power source connections. Circuitry is provided for programming and reading internal EEPROM memory of a portable radio with information provided by an external programming apparatus through its existing battery terminals, wihout removing the EEPROM from the unit, and without the use of supplementary connectors. The radio battery is disabled and a substitute power source is connected to the existing battery terminals, the substitute power signal is encoded with program data by the programming apparatus circuitry and decoded by the radio circuitry, and a programming voltage is applied to the EEPROM such that the program data is programmed into the radio memory through the battery terminals. The program data can be verified by encoding the substitute power signal with verification data in the radio and decoding the signal externally to provide a visual indication for verification. The present invention may be used with any electronic device having a programmable memory that warrants field re-programming.

51 Claims, 4 Drawing Sheets

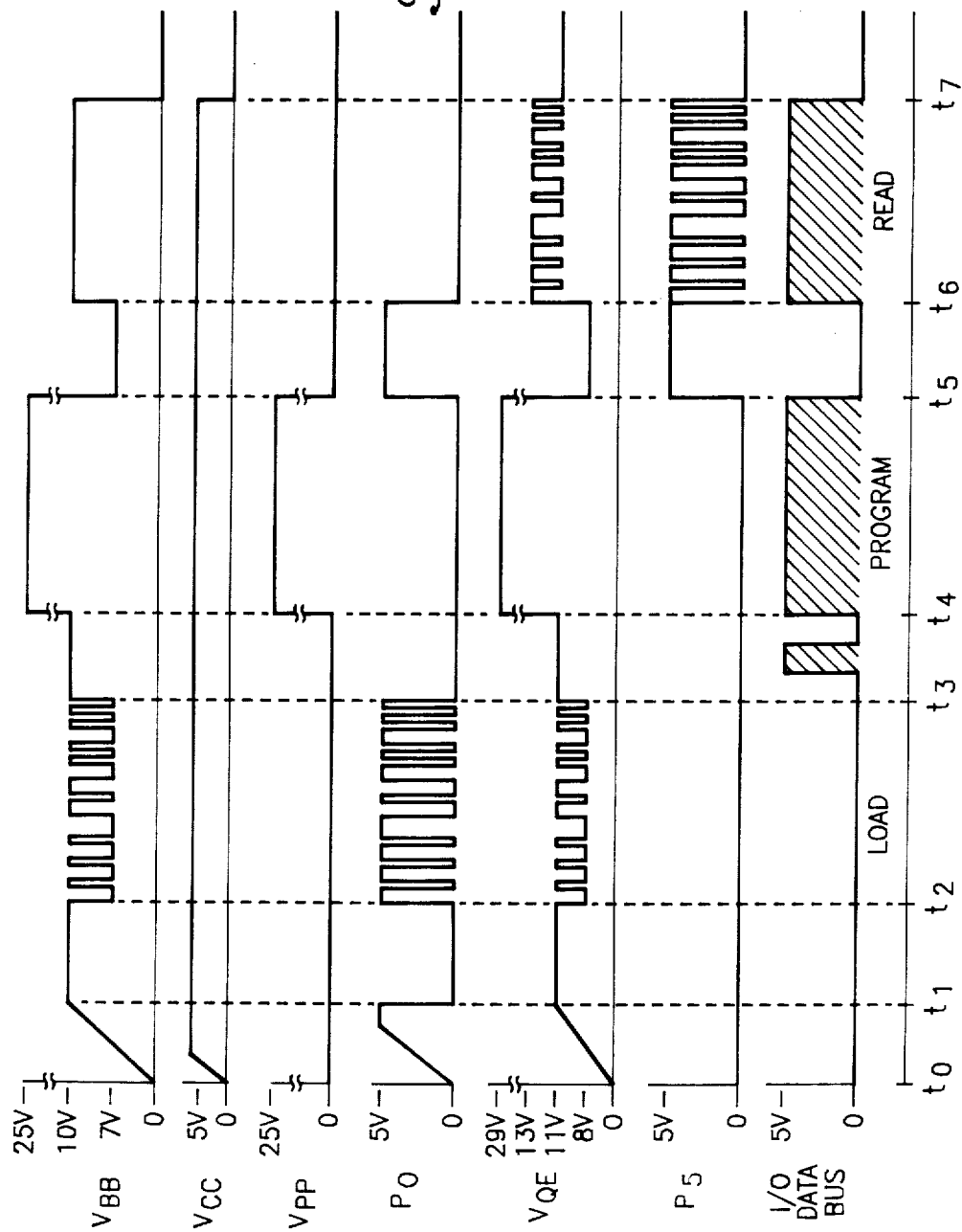

METHOD AND APPARATUS FOR PROGRAMMING MEMORY THROUGH BATTERY TERMINALS

BACKGROUND OF THE INVENTION

The present invention relates to the practice of field programming memory devices without removing the memory device from the product.

As microprocessor technology becomes more widespread, significantly more kinds of products are being "personalized" to a particular user's application by customized programming of the microprocessor memory. Analogously, as these memory devices become smaller and more cost-efficient, more features of a product are being incorporated into the realm of microprocessor-controlled functions. For example, modern microelectronic technology has permitted a significant increase in the flexibility of features and the number of system parameters designed to be programmed into two-way radios. Synthesizer channels, signalling identification codes, and optional user features are just a few of the microprocessor-controlled system parameters which are currently being programmed into the radio memory.

In the past, this program information has been stored in a fusible-link programmable read-only-memory (PROM) which must be replaced if the system parameters are ever changed. Not only is the removal of the PROM from the product time-consuming and labor-intensive, but also the replacement cost of the fusible-link PROM cannot be overlooked.

Another memory technology has allowed the introduction of the ultraviolet-erasable PROM (UV-EPROM) which may be erased and re-programmed. Although the UV erasable feature has eliminated the replacement cost disadvantage, the UV EPROM must still be removed from the product in order to expose the die to ultraviolet light for erasure. Hence, the reprogramming operation still incurs a relatively large amount of time to remove the PROM from the circuit, to expose the PROM to ultraviolet light for a period of up to thirty minutes to erase the old data, and to reprogram the PROM with new data.

A newer technology, that of the EEPROM (elecrically-erasable-programmable-read-only-memory), has the capability of being electrically erased and re-programmed in-circuit. This feature allows the "personality" of the product to be changed in the field without removing the PROM from the customer unit. In comparison to previous memory technology, the EEPROM has given new life to the electronics industry. EEPROMs offer the numerous advantages that: the EEPROM does not have to be removed from the circuit for programming, so the additional cost of a PROM socket is avoided; factory throughput is increased since "generic" products can be built, tested, and stocked; a wide variety of customer features can readily be programmed into an "off-the-shelf" unit to reduce delivery time; and subminiature inexpensive surface-mount chip memory devices may be utilized for size reduction, since PROM removal is now eliminated.

The implementation of EEPROM technology in portable equipment, such as hand-held radios, radio telephones, or pocket pagers, has encountered several difficulties with the programming operation. First of all, it is highly undesirable to disassemble the radio to connect a programming device to the leads of the EEPROM inside the radio, or to obtain access to the programming circuitry to place the device in the programming mode. Experience has shown that the practice of field-programming the radio by removing the radio covers has been linked to mechanical reliability and/or electrical tuning problems.

Secondly, the alternative approach of providing an externally-available programming connector is not easily implemented in a hand-held compact unit. This approach contradicts the size-minimization, cost-reduction, and minimum-redesign goals of most portable products. Furthermore, it is generally preferable to avoid using any additional externally-accessible connectors on a hand-held electrical device, so as to minimize weatherproofing and static protection problems.

The third approach, that of designing programming circuitry into each product, introduces similar cost, size, and complexity issues. It is readily apparent that a manufacturer of a low-cost pager, for example, would consider it ill-advised to include additional EEPROM programming circuitry inside every unit produced. Moreover, numerous low-cost EEPROMs require a +25 VDC programming voltage to erase and re-program the PROM. In a battery-powered portable radio application, the addition of the programming voltage generating circuitry into each unit is hardly feasible.

A need, therefore, exists for a way to program EEPROM memory inside a portable product that avoids the additional bulk, expense, complexity, and unreliability of supplementary connectors or complicated programming circuitry.

SUMMARY OF THE INVENTION

Accordingly, it is a general object of the present invention to provide an improved and simplified method to program memory inside an electronic device.

Another object of the present invention is to provide a method and apparatus for programming data into memory without requiring the use of additional connectors.

A further object of the present invention is to provide a method and apparatus for reading the programmed data to verify memory contents without removing the memory device from the unit.

A more particular object of the present invention is to provide improved circuitry for programming and reading EEPROM memory through a portable product's existing battery terminals without removing the EEPROM from the unit.

In brief, the present invention provides a method and apparatus of programming and reading an electronic device memory through its power source connections. The method comprises the steps of: disabling the electronic device power source; connecting a substitute power source to the power connections associated with the electronic device power source; encoding the substitute power signal with program data to provide a coded power signal to the electronic device; decoding the coded power signal to provide the program data to the electronic device programmable memory; and applying a programming voltage to the programmable memory such that the program data is programmed into the electronic device memory through the power connections. The method further comprises the steps of: reading the program data from the device memory to provide verification data; encoding the substitute power signal with the verification data; and decoding the substitute power signal to provide a visual indication of the verification data.

In an embodiment illustrative of the present invention, a memory programming system is provided which is capable of programming internal memory of a portable radio with information provided by an external programming apparatus through conventional battery connections. The memory programming system comprises: a regulated voltage source providing substitute voltage to the radio when the detachable battery is removed; a voltage modulator for encoding the substitute voltage according to predetermined serial program data to provide a programming signal; a means to couple the programming signal to the radio through the radio battery connections; a voltage regulator for regulating the programming signal to provide constant DC voltage to at least portions of the radio circuitry; a voltage demodulator for decoding the programming signal to provide serial program data to the radio memory; and a device controller for controlling the programming operation of the radio memory in response to the programming signal DC voltage levels and the serial program data such that the radio internal memory is programmed by the external programming apparatus through the radio battery connections. The memory programming system further comprises: a current modulator for encoding the program data read from the radio memory to provide serial verification data; a current demodulator for decoding the programming signal to provide the serial verification data; and a visual display to provide a visual indication of the the serial verification data, thereby verifying the contents of the radio memory.

The programming method and apparatus of the present invention may be used with any electronic device having a programmable memory that warrants field re-programming. For example, it is contemplated that the present invention would be particularly well-adapted for use in radio equipment, telephone equipment, electronic instrumentation, computers, calculators, or even toys.

BRIEF DESCRIPTION OF THE DRAWINGS

The features of the present invention which are believed to be novel are set forth with particularity in the appended claims. The invention itself, however, together with further and objects and advantages thereof, may best be understood by reference to the following description when taken in conjunction with the accompanying drawings, in which:

FIG. 4 is a graphic representation illustrating various waveforms of voltages in the circuits of FIG. 2 and FIG. 3.

DETAILED DESCRIPTION OF THE INVENTION

Figure 1:
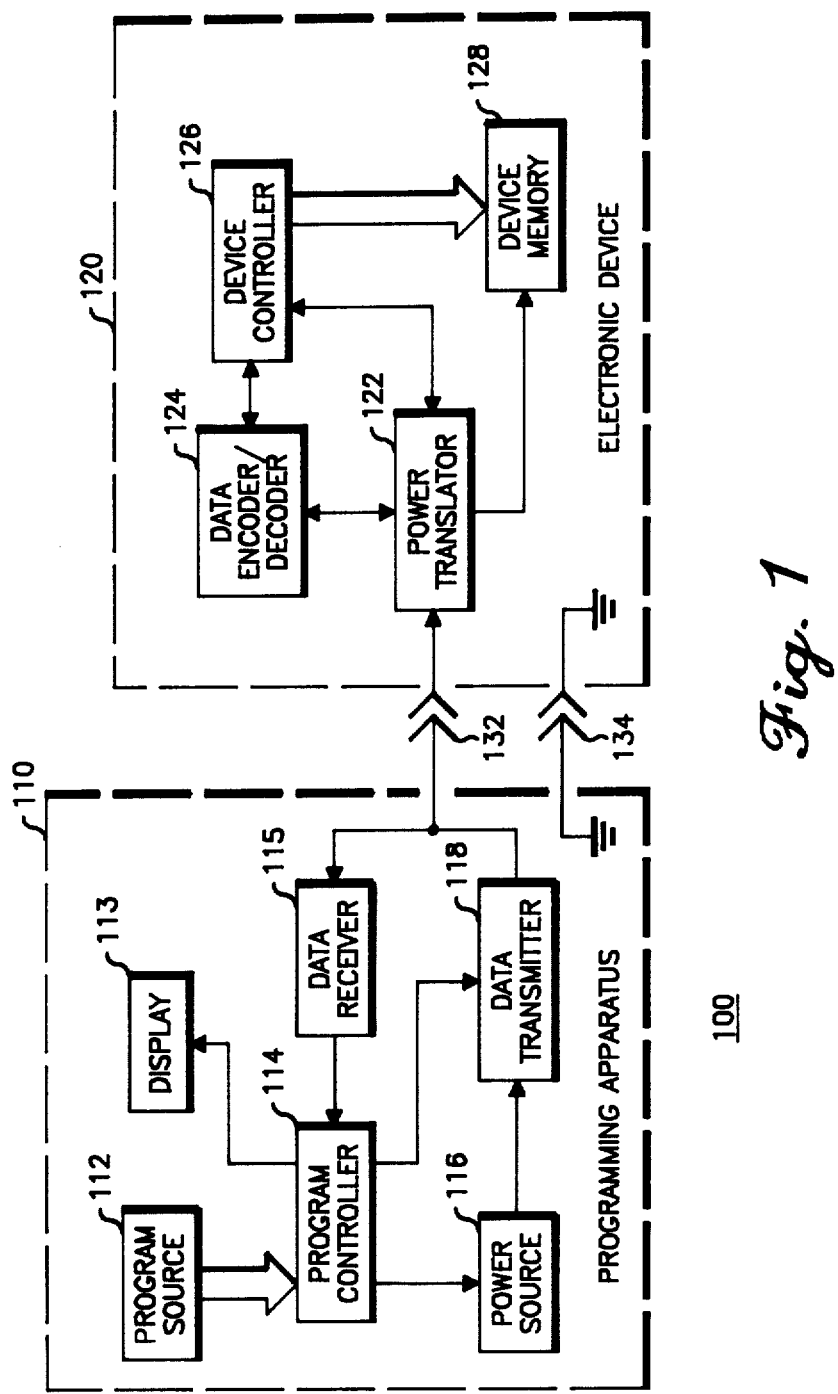
FIG. 1 is a block diagram of the memory programming system of the present invention.

Referring now to the drawings, FIG. 1 illustrates programming system 100 for programming and reading the memory of electronic device 120 with programming apparatus 110 through power connections 132 and 134. Program source 112 contains the data to be programmed into electronic device memory 128. Source 112 is typically a memory storage device in itself, such as a ROM or EEPROM. However, the program data may be locally generated in programming apparatus 110 by a keyboard or other means, or may be fed to programming apparatus 110 from an external source.

In either case, program data is applied to program controller 114, typically a microcomputer, which controls the sequence of steps performed during the programming/reading operation. More specifically, program controller 114 controls the various DC voltage levels of power source 116, applies program data to data transmitter 118, accepts verification data from data receiver 115, and controls the audio or visual indication of the verification data via display 113. Additionally, program controller 114 may interpret program data from program source 112 to data transmitter 118 according to a predetermined data format. For example, program controller 114 may translate parallel data from program source 112 into a serial data code which is used by data transmitter 118.

Data transmitter 118 performs the actual encoding function of the substitute power provided by power source 116 for application to electronic device 120. Any number of encoding schemes may be used to apply program data to this substitute power signal. For example, an amplitude modulator could be used for an analog encoding scheme, whereas a digital-to-analog converter (DAC) is generally used for digital encoding formats. The particular configuration of data transmitter 118 is dependent upon the desired encoding format. Similarly, power source 116 may be any source capable of producing a regulated DC voltage of a sufficient voltage and current level required of a programming voltage for the particular memory device.

Data receiver 115 permits verification of the programmed data read from device memory 128. Although proper programming verification may readily be achieved in certain types of electronic devices (i.e., those with limited data storage or visual display indicators), numerous low-cost portable products do not have this capability. Hence, once the device memory is programmed, the program data may be read from the memory, encoded onto the electronic device power connections 132/134, and applied to data receiver 115. The program data is then decoded in data receiver 115 and fed to program controller 114 for verification. This program data verification step may be comprised of an actual data display by display device 113, or simply an audio or visual indication to the user that the program data read from device memory 128 compares favorably to that originally provided by program source 112.

In short, programming apparatus 110 provides a coded (data-modulated) substitute power signal to electronic device 120 through electronic device power connections 132 and 134. In most applications, the original power supply for electronic device 120 would be removed during programming. It is possible, however, that this power supply may simply be electronically disconnected without physically removing the supply (e.g., by a switch). In the case of a battery, however, it is very convenient to simply remove the battery and substitute the appropriate connections of the programming apparatus to the associated battery terminals. In either case, programming apparatus 110 furnishes (a)

nominal operating power for the electronic device; (b) programming voltage for the device memory; (c) programming data for the device memory; and (d) some indication of programming verification.

The coded power signal from programming apparatus 110 is first applied to power translator 122 for distribution to the other blocks of electronic device 120. Depending on the particular electronic device configuration and power requirements, power translator 122 may need to perform numerous functions. First, a regulated supply voltage may be provided for parts of the electronic device circuitry which must be active during programming (i.e., the device controller 126). Second, a higher programming voltage (e.g., +25 VDC for many EEPROMS) must be separated from the power signal and applied only to device memory 128 during memory programming intervals. Third, the encoded program data from the power connections must be applied to data encoder/decoder 124. Fourth, the encoded verification data from the data encoder/decoder can be routed to power connections 132/134. Fifth, various other functions may be required in particular applications, such as: providing overvoltage protection; disabling internal power sources; distributing various power levels to different circuit portions; etc. All of these other functions may also be performed by power translator 122. Hence, power translator 122 serves to distribute power and data throughout electronic device 120. (Refer to the description of FIG. 2 for further details of the power translator circuitry.)

In the preferred embodiment, the coded power signal is applied directly to data encoder/decoder 124, where it is decoded to provide the original program data to device controller 126. Again, the particular configuration of data encoder/decoder 124 will be dependent upon the encoding format utilized. In an analog system, an analog-to-digital converter (ADC) may be required, whereas the digital modulation scheme of the present invention utilizes a DC voltage level detector.

Data encoder/decoder 124 is also used for program data verification. After the device is programmed, device controller 126 reads the programmed data from device memory 128, interprets the program data format for encoding, and applies this information as verification program data to data encoder/decoder 124. The verification data is then re-encoded onto the power line through power translator 122, and fed to data receiver 115 via power connections 132/134. Hence, the electronic device power lines serve the dual purposes of power transmission and read/write data busses.

During the programming operation, device controller 126 interprets the decoded program data format for application to device memory 128. Device controller 126 may, for example, "shift-in" serial data to provide a parallel data format to the device memory. During the verification operation, device controller 126 reads programmed data from device memory 128 and, depending on the verification encoding format, interprets this data for application to data encoder/decoder 124. In some applications, such as that of the preferred embodiment, device controller 126 also controls the application of the programming voltage to device memory 128 in response to information obtained from the different programming voltage levels. The sequence of programming steps performed by device controller 126 will be discussed in the description accompanying FIG. 4. Device controller 126 is typically a microcomputer, and its function may be combined with the existing electronic device microcomputer through the use of a PROM-programming subroutine. Device memory 128 is the existing EEPROM memory of electronic device 120.

In summary, FIG. 1 shows the general system configuration for programming and verifying internal memory of an electronic device with information provided by an external programming apparatus through conventional power connections.

Figure 2:
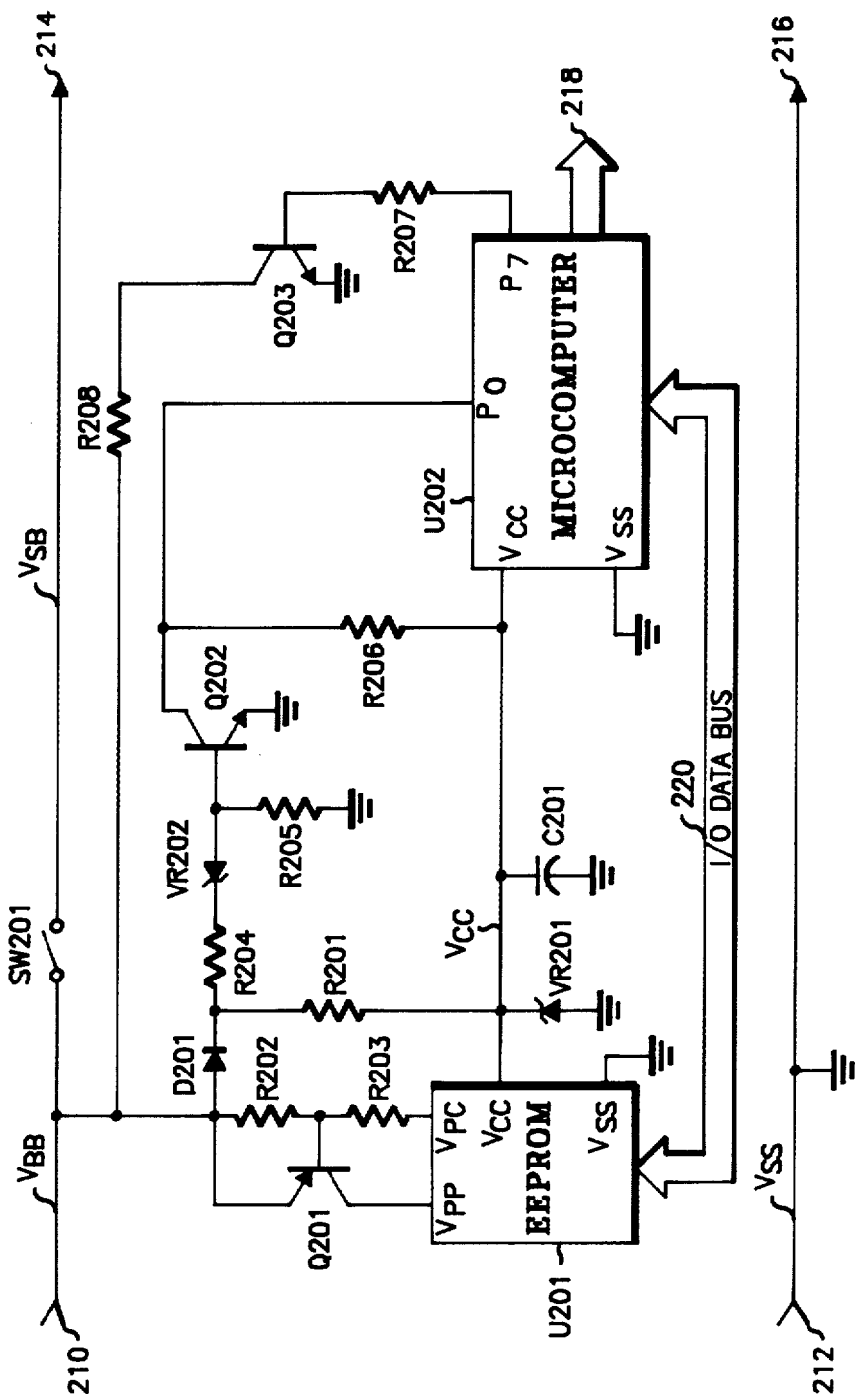
FIG. 2 is a schematic representation of the programming/reading circuitry included within the electronic device to be programmed in accordance with the preferred embodiment of the present invention.

FIG. 2 illustrates programming/reading circuitry 200 located inside electronic device 120 according to the preferred embodiment. Battery terminals 210 and 212 correspond to power connections 132 and 134, respectively, of FIG. 1. Furthermore, microcomputer U202, such as a Motorola type MC146805G2 8-bit microcomputer, is used as device controller 126. The function of device memory 128 is performed by EEPROM U201, which, in the preferred embodiment of a display radio pager, is a Motorola type MCM2801 256-bit serial electrically-erasable PROM.

Under normal operating conditions (not programming operations), power switch SW201 is closed to permit battery voltage $V_{BB}$ to be applied to the remaining device circuitry through terminal 214 as switched battery voltage $V_{SB}$. (Ground $V_{SS}$ from battery terminal 212 is always applied to the electronic device circuitry through terminal 216.) However, during programming, it would be detrimental to permit a high (+25 VDC) programming voltage to be applied to the remaining device circuitry. Hence, switch SW201 remains in the open position during programming. Switch SW201 is part of power translator 122 of FIG. 1.

Battery voltage $V_{BB}$, applied through diode D201, is regulated for use by EEPROM U201 and microcomputer U202 by resistor R201 and zener diode VR201. This regulated voltage, $V_{CC}$, is filt-ered by capacitor C201 and applied to the appropriate $V_{CC}$ terminals of the devices requiring power during the programming operation. These regulator components also form a part of power translator 122. In the preferred embodiment. $V_{CC}$ equals +5 VDC, whereas $V_{BB}$ varies between +7 and +25 VDC during programming. (Refer to FIG. 4 for programming voltage waveforms.)

Transistor Q201 and resistors R202 and R203 perform the function of controlling the programming voltage to the programmable memory. These components are also a part of power translator 122 of FIG. 1. Program voltage control pin $V_{PC}$ is an open-drain output on EEPROM U201 that is active when a WORD ERASE or WRITE control code is placed on I/O data bus 220 by microcomputer U202. (Depending on the particular EEPROM used, $V_{PC}$ may only provide active-low pulses.) When $V_{PC}$ goes low, PNP transistor Q201 saturates, and the +25 VDC programming voltage from the programming apparatus is applied to programming pin $V_{pp}$. Hence, EEPROM U201 can only be reprogrammed under control of microcomputer U202. The control signals to the microcomputer are derived from the incoming power signal by monitoring its DC voltage level $V_{BB}$ as explained in FIG. 4.

The combination of resistors R204, R205, and R206, zener diode VR202, and NPN transistor Q202 perform the decoding function of data encoder/decoder 124 of FIG. 1. Whenever the DC voltage level of the data modulation on $V_{BB}$ rises above the breakdown voltage of zener diode VR202 (plus the voltage drops of silicon diode D201 and baseemitter junction of Q202), transistor Q202 becomes saturated to effectively ground input port $P_0$ of microcomputer U202. When the modulation level is below this threshold, the transistor is off, and resistor R206 pulls port P0 high to voltage $V_{CC}$. In this way, a simple one-transistor voltage level detection circuit performs the function of demodulating the program data impressed upon the substitute power signal according to the data-modulation format of the preferred embodiment. Again, the waveforms of FIG. 4 clearly illustrate the sequence of programming events by showing voltages at points $V_{BB}$, $V_{CC}$, $V_{PP}$, and P0.

Once EEPROM U201 has been programmed, the data verification process begins. Microcomputer U202 reads the recently-programmed data from EEPROM U201 via I/O data bus 220. The microcomputer then interprets the program data into an appropriate data format for encoding (e.g., a serial data code.) This verification data is then modulated onto the power line through output port P7, and the encoding components of data encoder/decoder 124—resistor R207, NPN transistor Q203, and resistor R208. Since R208 is a relatively low value resistor (e.g., on the order of 1000 Ohms), the saturation of transistor Q203 at the verification data rate serves to modulate the current drawn by electronic device 120. Although the $V_{BB}$ remains at a constant regulated voltage, the current drain modulation can be measured by programming apparatus 110. Hence, the data programmed into the EEPROM may be verified through the power connections of the electronic device. Refer to FIG. 4 for a more detailed explanation of the verification operation.

In short, FIG. 2 illustrates that a minimal amount of circuitry is required inside the electronic device to control the programming and reading procedures of the device memory. Furthermore, additional portions of this circuitry may be eliminated if an EEPROM capable of +5 VDC programming is used. In an alternative display pager embodiment, microcomputer U202 may interface verification data to the pager display via data bus 218 to instantaneously display the new pager code for verification. Additionally, in the preferred embodiment, switch SW201 also functions as the pager on/off switch. It is further contemplated that some or all of the discrete parts of programming circuitry 200 may be integrated along with other circuitry into a custom support circuit.

Figure 3:
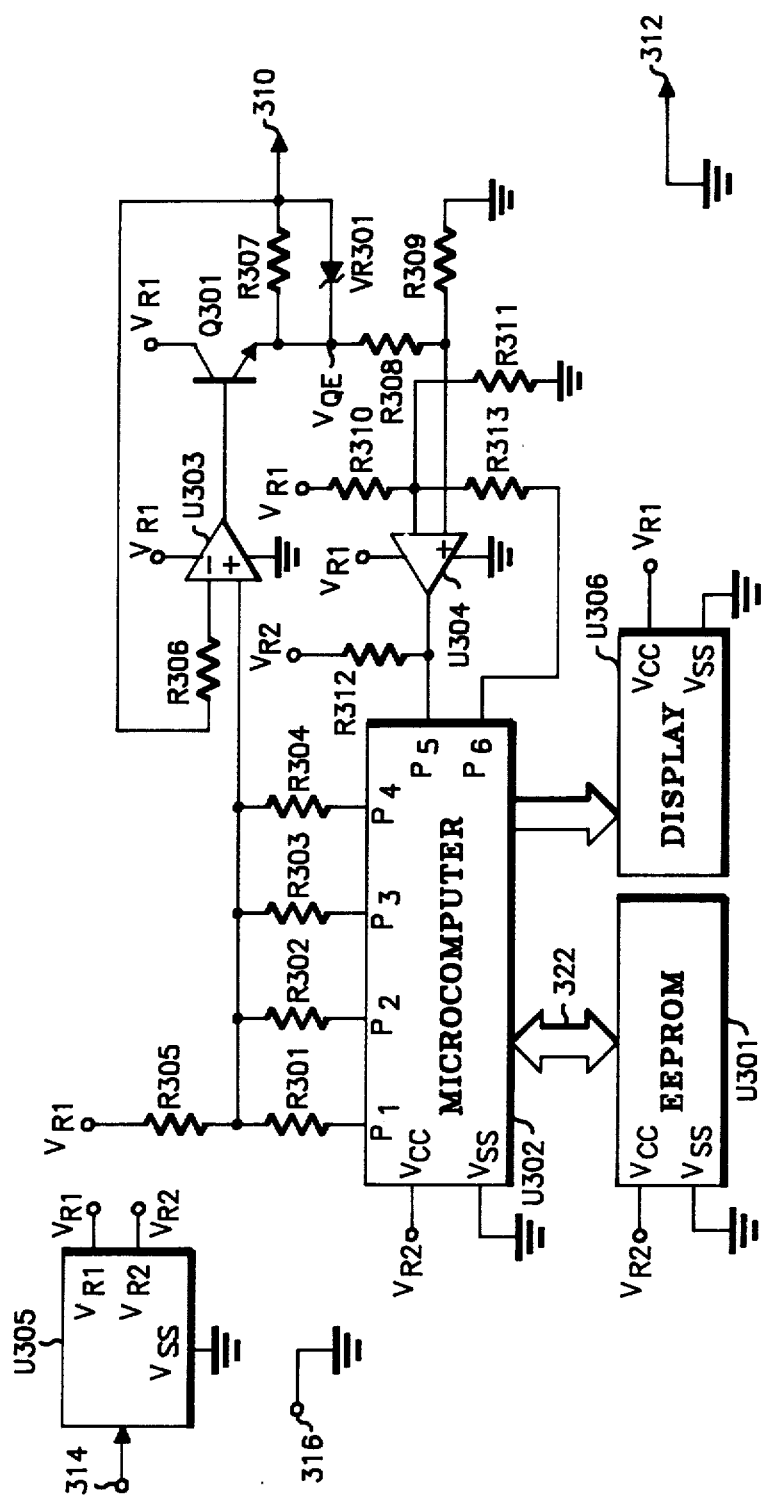
FIG. 3 is a schematic representation of the programming/reading circuitry included within the external programming apparatus in accordance with the preferred embodiment of the present invention.

FIG. 3 illustrates programming apparatus circuitry 300 which is compatible with circuitry 200 of FIG. 2. Power supply U305 uses an input power source (such as the 110VAC line or a battery) connected to input terminals 314 and 316 to provide regulated voltages for programming apparatus 110. In the preferred embodiment, power supply U305 furnishes regulated +32 VDC at $V_{R1}$ to derive the programming voltage, and a regulated +5 VDC at $V_{R2}$ for supply voltages. Ground $V_{SS}$ from input terminal 316 is distributed throughout, and is also available at programming apparatus ground terminal 312.

Programming apparatus terminals 310 and 312 are directly coupled to electronic device battery terminals 210 and 212, respectively. In some applications, it may prove advantageous to provide interconnection cables with appropriate connectors from the programming apparatus. When the (internal) battery is removed, the mating cable connectors would be attached to the battery terminals of the electronic device. In other applications, where the electronic device has externally-accessible battery terminals once the battery is detached, the entire device may simply be inserted into an appropriate programming socket. An example of this configuration would be a pocket pager recharging stand. In any case, the present invention provides a means to program the device memory through the conventional power connections.

EEPROM U301 functions as program source 112 of FIG. 1, providing the program data to be programmed into the electronic device memory. Like EEPROM U201, U301 in the preferred embodiment is a Motorola-type MCM2801 256-bit serial EEPROM.

Microcomputer U302 obtains program data from U301 through data bus 322, and functions as program controller 114 of FIG. 1. A Motorola type MC146805G2 8-bit microcomputer is again used as controller U302. By grounding various combinations of microcomputer output ports $P_1$, $P_2$, $P_3$, and $P_4$, different voltage levels are produced at the junction of resistors R301, R302, R303, R304, and R305, which is the positive input of operational amplifier U303. As a result, the output of op-amp U303 provides a data-modulated voltage to the base of NPN transistor Q301, which is configured as an emitter-follower. Q301 then applies the voltage modulation through resistor R307 to programming apparatus terminal 310 as shown. (The function of zener diode VR301 will be discussed later.) FIG. 4 illustrates the voltage waveforms of Q301 emitter voltage $V_{QE}$ and battery voltage $V_{BB}$ available at terminal 310.

During the program data verification procedure, comparator U304 and associated circuitry is used to translate the current modulation received at programming apparatus terminal 310 into voltage information applied to microcomputer input port $P_5$. Since the negative feedback for op-amp U303 is obtained directly from terminal 310 through resistor R306, the battery voltage $V_{BB}$ remains constant during the current modulation. However, the varying current through resistor R307 may be measured as a voltage variation at $V_{QE}$, the emitter of transistor Q301. For example, if current modulation load resistor R208 (FIG. 2) is 1000 ohms, and $V_{BB}$ is +10 VDC, there will be a current change of 10 milliamps whenever transistor Q203 is turned on. Accordingly, if resistor R307 is 200 ohms, there will be 2.0 volts of verification data modulation at $V_{QE}$. (Zener diode VR301 is not conducting during the data verification procedure.) When this modulation voltage is applied to the negative input of comparator U304 through resistor R308, and compared to a reference voltage at the positive input developed by resistors R310 and R311, the 2.0 voltage change will be translated to 0-5 VDC by resistor R312 to be read at microcomputer input port $P_5$. This voltage translation may be readily understood by viewing the various waveforms of FIG. 4.

Microcomputer U302 then uses the verification data obtained from input port $P_5$ to perform some indication to the user of the validity of the programmed data. As previously mentioned, the microcomputer may simply compare the verification data from port $P_5$ to the original program data stored in EEPROM U301, and give a visual (or audio) indication if correct. In other applications, it may be required that the actual data read from electronic device memory 128 be displayed in its entirety. Hence, display device U306 would be used to indicate the data via LEDs, LCDs, etc. In still other applications, display U306 may be part of an external display system, such as a CRT screen. This application would prove particularly useful in factory test systems where the program data is changed specifically for performance evaluation of the electronic device.

The current-to-voltage translation circuitry of FIG. 3 may also be utilized to ensure that the remaining electronic device circuity has been disabled. For example, in the configuration of FIG. 2, the application of a +25 VDC programming voltage to the remaining radio circuitry through switch SW201 and terminal 214 could be destructive. Therefore, microcomputer U302 only increases the initial programming voltage at $V_{BB}$ to a level sufficient to measure the current drawn by the electronic device. In this way, if the remaining electronic device circuitry has not been disabled (via SW201 in this example), the additional current drain will provide notice to the microcomputer to turn off the programming voltage before any damage is done.

The operation of this automatic safety feature will now be described. Microcomputer U302 output port $P_6$, normally high impedance, provides an active-low to resistor R313 before the programming procedure begins. The addition of R313 to its parallel resistor R311 lowers comparator U304's positive input voltage to a predetermined safety threshold. Then the microcomputer grounds the appropriate $P_1-P_4$ output ports to produce a test programming voltage, equal or less than the nominal electronic device operating voltage, to terminal 310. The current drain through resistor R307, obtained as before via voltage translation at $V_{QE}$, is then measured. If excessive current is indicated, the voltage at the negative input of comparator U304 will be greater than the safety threshold, and input port $P_5$ will be pulled to ground. When the microcomputer reads port $P_5$ as a low input during this current-measuring test period, it will then instruct output ports $P_1-P_4$ to turn off the programming voltage altogether. For example, if the test programming voltage is 5.0 VDC, and if the safety threshold is set to 5.2 VDC, any current drain in excess of 1 milliamp (through 200 Ohm R307) would trigger the turnoff mechanism. Hence, the current-to-voltage translation circuitry of comparator U304 serves the secondary purpose of verifying that the remaining electronic device circuity has been disabled.

During the programming operation of an EEPROM requiring a +25 VDC programming voltage, the battery voltage $V_{BB}$ must be raised a significant amount from the normal programming voltage level. If a simple zener diode voltage regulator circuit is utilized (as illustrated in FIG. 2), this programming voltage increase may present current drain problems during the +25 VDC programming period. For example, since regulator resistor R201 must be a low value (470 Ohms) to provide proper +5 VDC regulation at normal $V_{BB}$ levels (+7 to +10 VDC), the same regulator, operating from +25 VDC, will cause a substantial voltage drop (more than +8 VDC) across programming apparatus resistor R307. Therefore, a 4 volt zener diode, VR301, is connected in parallel to limit this voltage drop. Zener diode VR301 only conducts during the actual +25 VDC programming interval.

In summary, FIG. 3 illustrates how the program data can be voltage-modulated onto the power lines for programming, and how the current modulation from the battery terminals may be read for data verification. Additionally, FIG. 3 shows that the initial electronic device current drain can be used to indicate whether the remaining device circuitry has been disabled. Although programming apparatus circuitry 300 shows but one embodiment, numerous other circuit configurations may be designed to accomplish the same programming-/verifying functions.

A representative set of component values for the programming system circuitry of FIG. 2 and FIG. 3 is listed below:

| | |
|---|---|
| R201 | 470 Ohms |
| R202 | 10K |
| R203 | 47K |
| R204 | 10K |
| R205 | 8.2K |
| R206 | 47K |
| R207 | 27K |
| R208 | 1K |
| R301 | 17.5K |
| R302 | 234 Ohms |
| R303 | 2.2K |
| R304 | 3.6K |
| R305 | 5K |
| R306 | 10K |
| R307 | 200 Ohms |
| R308 | 5K |
| R309 | 220K |
| R310 | 5K |
| R311 | 3K |
| R312 | 10K |
| R313 | 180Ω |
| C201 | 10 uF |
| D201 | Silicon |
| VR201 | 5 VDC zener |
| VR202 | 7 VDC zener |
| VR301 | 4 VDC zener |
| Q201 | Motorola PNP type M9643 |
| Q202 | Motorola NPN type M9642 |
| Q203 | Motorola NPN type M9642 |
| Q301 | Motorola NPN type M9642 |
| U201 | Motorola type MCM2801 |
| U202 | Motorola type MC146805G2 |
| U301 | Motorola type MCM2801 |
| U302 | Motorola type MC146805G2 |
| U303 | Motorola type MC1741 |
| U304 | Motorola type MC3302 |

FIG. 4 illustrates the voltage waveforms observed at various points throughout circuits 200 and 300. The upper-most graph illustrates that battery voltage $V_{BB}$, applied from programming apparatus terminal 310 to electronic device terminal 210, is only voltage-modulated during the time interval $t_2-t_3$, representing the program data LOAD period. The next graph illustrates that regulated voltage $V_{CC}$ of FIG. 2 remains constant at +5 VDC throughout the entire LOAD, PROGRAM and READ periods. The graph of the voltage present at programming pin $V_{PP}$ of FIG. 2 shows that the +25 VDC programming voltage is only available during the time interval $t_4-t_5$, which represents the PROGRAM period. (As previously mentioned, waveform $V_{PP}$ may actually appear as pulses, depending upon the EEPROM used.) The graph of the voltage present at microcomputer U202 input port $P_0$ illustrates the demodulated program data at various times. The $V_{QE}$ graph, representing the voltage at the emitter of transistor Q301, illustrates the current modulation during the READ period. (We are not concerned with this information during other time periods.) The $P_5$ graph shows the verification data present at microcomputer U302 input port $P_5$. Finally, the I/O data bus graph represents the active data periods of bus 220.

The following sequence of steps illustrates the operation of the present invention. The times $t_0$ through $t_7$ mentioned below refer to the time scale line at the bottom of FIG. 4.

At $t_0$, the detachable battery has been removed from the radio, and the programming apparatus terminals 310 and 312 are connected to radio battery terminals 210 and 212 respectively. Although not specifically illustrated in FIG. 4, the current-measuring safety feature, described in conjunction with FIG. 3, verifies during the $t_0$–$t_1$ period that the remaining electronic device circuitry has been disabled. After this safety check, the output ports $P_1$–$P_4$ of program controller microcomputer U302 are set to provide a constant +10 VDC programming voltage output. Hence, $V_{BB}$ is raised from 0 VDC at $t_0$ to +10 VDC at $t_1$. Accordingly, $V_{CC}$ approaches and maintains a regulated +5 VDC sometime before $t_1$. Similarly, microcomputer U202 input port $P_0$ will approach $V_{CC}$ through resistor R206. However, when $V_{BB}$ reaches approximately +8.4 VDC (0.7 VDC for diode D201, 7 VDC for zener diode VR202, plus 0.7 VDC for base-emitter of transistor Q202), transistor Q202 will become saturated, and port $P_0$ will be clamped to 0 VDC. $V_{PP}$ also remains at 0 VDC, since microcomputer U202 has not provided EEPROM U201 with a valid WORD ERASE or WRITE code via I/O data bus 220. (We are not concerned with $V_{QE}$ or $P_5$ at this time.)

At $t_1$, microcomputer U202 starts and begins its internal power-up reset routine, since its supply voltage $V_{CC}$ was removed sometime before $t_0$. One of the first program steps performed by microcomputer U202 is to check the status of input port $P_0$. If a programming operation is to be performed, $V_{BB}$ will be set equal +10 VDC, such that input port $P_0$ will equal 0 VDC. When microcomputer U202 reads port $P_0$ as a low input directly after power-up, it then reverts to its set of memory programming instructions and waits for the program data.

At $t_2$, the programming apparatus generates bit patterns using +10 VDC for a binary 0, and +7 VDC for a binary 1. Hence, when the first binary 1 is sent, the 10 volt-to-7 volt transition causes transistor Q202 to cut off. $P_0$ is then pulled to +5 VDC through resistor R206. This positive edge $P_0$ transition at $t_2$ signals the microcomputer to start receiving data.

Program data is sent from programming apparatus 110 to microcomputer U202 during the LOAD time interval $t_2$–$t_3$. The microcomputer waits approximately 300 microseconds from the first positive edge transition at $t_2$, then begins to sample input port $P_O$ at approximately 500 microseconds-per-bit. Depending on the encoded data format, the program data may include a preamble code, a sync code, start or stop bits, parity bits, etc. In the preferred embodiment, wherein an 80-bit pager code is programmed, the $t_2$–$t_3$ time interval is approximately 40 milliseconds in duration. (The timing diagrams and voltage waveforms of FIG. 4 are only representative and are not intended to depict actual data.)

At $t_3$, all the programming data has been sent, and programming $V_{BB}$ returns to +10 VDC. Accordingly, input port $P_0$ returns to 0 VDC and remains there. During the time interval $t_3$–$t_4$, microcomputer U202 performs the necessary data manipulation to rearrange the program data to an appropriate format for EEPROM U201. In the present embodiment, this procedure simply consists of (a) loading a WRITE control code onto I/O data bus 220 to cause program voltage $V_{PC}$ to be active, and (b) loading the program data onto I/O data bus 220.

At $t_4$, programming apparatus 110 applies +25 VDC to $V_{BB}$. Since the proper WRITE code is now available, $V_{PC}$ becomes an active-low such that PNP transistor Q201 becomes saturated. Hence, programming pin voltage $V_{PP}$ is switched to +25 VDC. (Again, depending on the EEPROM, $V_{PP}$ may actually appear as a pulse train—not a constant +25 VDC as shown in FIG. 4.) During the PROGRAM time interval $t_4$–$t_5$, microcomputer U202 sends the program data to EEPROM U201 via I/O data bus 220. $V_{BB}$ is held at +25 VDC (+29 VDC at $V_{QE}$ minus 4 volt zener VR301) for approximately two seconds to allow enough time to perform this operation.

At $t_5$, programming apparatus 110 sets $V_{BB}$ to +7 VDC to signify the start of the verification cycle. When microcomputer U202 sees the corresponding positive edge transition on input port $P_0$, the microcomputer addresses the first location of EEPROM data to be read.

During $t_6$–$t_7$, the READ time interval, the microcomputer reads the program data from the EEPROM to verify correct programming. (In an alternate embodiment of a display pager, microcomputer U202 would simultaneously provide at least the new code plug information to the pager display via data bus 218.) The program data is applied to microcomputer U202 output port $P_7$ as verification data. The 0 to +5 VDC voltage modulation at $P_7$ is converted to 10 milliamps of current modulation via transistor Q203 and associated components. When these current changes appear at the programming apparatus, corresponding voltage changes are developed across R307. (Zener diode VR301 remains off during this cycle.) Although $V_{BB}$ remains constant at +10 VDC due to the negative feedback through R306 to op-amp U303, the current modulation is shown in FIG. 4 as +11-to-13 VDC voltage changes at $V_{QE}$. Comparator U304 shifts this verification data voltage level to 0-to-5 VDC for application to microcomputer U302 input port $P_5$, as shown. Microcomputer U302 then interprets this verification data for application to display device U306. If the data displayed is not acceptable, then the programming sequence must be re-initiated. If the data displayed is acceptable, programming voltage $V_{BB}$ is set to 0 VDC at $t_7$.

Since the EEPROM data storage format of the present embodiment is straight serial binary data processed one bit at a time, microcomputer U202 can output the program data to port $P_7$ bit-by-bit as the memory device is being read. Had the data format been of a different type, the READ cycle might take longer to interpret the data before encoding it to the power line in a serial manner.

In summary, a novel method and apparatus for programming and reading electronic device memory through conventional power connections has been disclosed. The instant invention is particularly well adapted for use with portable radios and pagers. However, as stated above, any application requiring convenient, low-cost field programming may benefit from this technique.

While specific embodiments of the present invention have been shown and described herein, further modifications and improvements may be made by those skilled in the art. All such modifications which retain the basic underlying principles disclosed and claimed herein are within the scope of this invention.

What is claimed is:

1. A method of programming data into a portable electronic device having programmable memory, a device controller, and a portable power source with associated power connections, said programming method comprising the steps of:

(a) disabling said electronic device power source;

(b) connecting a substrate power source to said power connections to provide a substitute power signal;

(c) encoding said substitute power signal with the program data to provide a coded power signal to said electronic device;

(d) decoding said coded power signal to provide said program data to said programmable memory; and (e) applying a programming voltage to said programmable memory, whereby said program data is programmed into said electronic device memory through said power connections.

2. The programming method according to claim 1, wherein said electronic device is a portable radio.

3. The programming method according to claim 1, wherein said programmable memory is an EEPROM.

4. The programming method according to claim 1, wherein said device controller is a microcomputer.

5. The programming method according to claim 1, wherein said electronic device power source is a battery.

6. The programming method according to claim 1, wherein step (c) is performed by voltage modulating said substitute power signal.

7. The programming method according to claim 6, wherein said voltage modulating step is performed by varying the DC voltage level of said substitute power signal in digital steps at a rate corresponding to said program data and at a level above the nominal voltage level of said electronic device power source.

8. The programming method according to claim 1, wherein said programming voltage is greater than the nominal voltage of said electronic device power source.

9. The programming method according to claim 1, further comprising the steps of:

(f) reading said program data from said device memory to provide verification data; and (g) providing a visual indication of said verification data.

10. The programming method according to claim 1, further comprising the steps of:

(f) reading said program data from said device memory to provide verification data;

(g) encoding said substitute power signal with said verification data;

(h) decoding said substitute power signal to provide said verification data; and (i) displaying said verification data to provide a visual indication of the contents of said electronic device memory.

11. The programming method according to claim 10, wherein step (g) is performed by current modulating said substitute power signal.

12. The programming method according to claim 11, wherein said current modulating step is performed by varying the DC current drain of said substitute power signal in digital steps at a rate corresponding to said verification data.

13. A memory programming system for programming data into a portable electronic device having programmable memory, a device controller, and a portable power source with associated power connections, said programming system comprising in combination:

a programming apparatus including means for providing a substitute power signal to said power conenctions when said electronic device power source is disabled:

means for encoding said substitute power signal with the program data to provide a coded power signal to said electronic device; said electronic device including means for disabling said electronic device power source;

means for decoding said coded power signal to provide said program data to said programmable memory; and means for applying a programming voltage to said programmable memory, whereby said program data is programmed into said electronic device memory through said power connections.

14. The memory programming system according to claim 13, wherein said electronic device is a portable radio.

15. The memory programming system according to claim 13, wherein said programmable memory is an EEPROM.

16. The memory programming system according to claim 13, wherein said device controller is a microcomputer.

17. The memory programming system according to claim 13, wherein said electronic device power source is a battery.

18. The memory programming system according to claim 13, wherein said encoding means includes means for voltage modulating said substitute power signal.

19. The memory programming system according to claim 18, wherein said voltage modulating means varies the DC voltage level of said substitute power signal in digital steps at a rate corresponding to said program data and at a level above the nominal voltage level of said electronic device power source.

20. The memory programming system according to claim 13, wherein said programming voltage is greater than the nominal voltage of said electronic device power source.

21. The memory programming system according to claim 13, wherein said programming voltage applying means includes means for controlling the programming operation of said programmable memory in response to said program data.

22. The memory programming system according to claim 13, wherein said electronic device further includes:

means for reading said program data from said device memory to provide verification data; and wherein said programmable apparatus further includes:

means for providing a visual indication of said verification data.

23. The memory programming system according to claim 13, wherein said electronic device further includes:

means for reading said program data from said device memroy to provide verification data;

means for encoding said substitute power signal with said verification data; and wherein said programming apparatus further includes:

means for decoding said substitute power signal to provide said verification data;

means for displaying said verification data to provide a visual indication of the contents of said electronic devie memory.

24. The memory programming system according to claim 23, wherein said encoding means includes means for current modulating said sbustitute power signal.

25. The programming method according to claim 24, wherein said current modulating means varies the DC current drain of said substitute power signal in digital steps at a rate corresponding to said verification data.

26. A method of programming internal memory of a portable radio with predetermined serial program data provided by an external programming apparatus, said radio having a detachable battery and associated battery terminals, said programming method comprising the steps of:
 (a) detaching said radio battery;
 (b) providing a substitute voltage;
 (c) modulating said substitute voltage according to said serial program data to provide a programming signal;
 (d) coupling said programming signal to said radio through said radio battery terminals;
 (e) regulating said programming signal to provide constant DC voltage to at least portions of said radio;
 (f) demodulating said programming signal to provide said serial program data to said radio memory; and
 (g) controlling the programming operation of said radio memory in response to said programming signal DC voltage levels and said serial program data, whereby said radio internal memory is programmed by said external programming apparatus through said radio battery terminals.

27. The programming method according to claim 26, wherein said portable radio is a pocket pager.

28. The programming method according to claim 26, wherein said radio internal memory is an EEPROM.

29. The programming method according to claim 26, wherein step (c) is performed by said external programming apparatus.

30. The programming method according to claim 26, wherein step (f) is performed internally to said radio.

31. The programming method according to claim 26, wherein step (c) is performed by voltage modulating said substitute voltage.

32. The programming method according to claim 31, wherein said voltage modulating step is performed by varying the DC voltage level of said substitute voltage in digital steps at a rate corresponding to said serial program data and at a level above the nominal voltage level of said radio battery.

33. The programming method according to claim 26, wherein said programming voltage is greater than the nominal voltage of said radio battery.

34. The programming method according to claim 33, wherein step (b) includes the step of measuring the current drain of said portable radio before said substitute voltage is raised to its final programming voltage level.

35. The programming method according to claim 26, further comprising the steps of:
 (h) reading said program data from said radio memory to provide serial verification data; and
 (i) providing a visual indication of said serial verification data.

36. The programming method according to claim 26, further comprising the steps of:
 (h) reading said program data from said radio memory to provide serial verification data;
 (i) modulating said programming signal with said serial verification data;
 (j) demodulating said programming signal to provide said serial verification data; and
 (k) displaying said serial verification data to provide a visual indication of the contents of said radio memory.

37. The programming method according to claim 36, wherein step (i) is performed internally to said radio.

38. The programming method according to claim 36, wherein step (j) is performed externally to said radio.

39. The programming method according to claim 36, wherein step (i) is performed by current modulating said programming signal.

40. The programming method according to claim 39, wherein said current modulating step is performed by varying the DC current drain of said programming signal in digital steps at a rate corresponding to said serial verification data.

41. A memory programming system capable of programming internal memory of a portable radio with predetermined serial program data provided by an external programming apparatus, said radio having a detachable battery and associated battery terminals, said programming system comprising: said external programming apparatus including
 means for providing a substitute voltage when said radio battery is detached;
 means for modulating said substitute voltage according to the serial program data to provide a programming signal;
 means for coupling said programming signal to said radio through said radio battery terminals; said portable radio including
 means for detaching said radio battery;
 means for regulating said programming signal to provide constant DC voltage to at least portions of said radio;
 means for demodulating said programming signal to provide the serial program data to said radio memory; and
 means for controlling the programming operation of said radio memory in response to said programming signal DC voltage levels and said serial program data, whereby said radio internal memory is programmed by said external programming apparatus through said radio battery terminals.

42. The memory programming system according to claim 41, wherein said portable radio is a pocket pager.

43. The memory programming system according to claim 41, wherein said radio internal memory is an EEPROM.

44. The memory programming system according to claim 41, wherein said modulating means includes means for voltage modulating said substitute voltage.

45. The memory programming system according to claim 44, wherein said voltage modulating means varies the DC voltage level of said substitute voltage in digital steps at a rate corresponding to said serial program data and at a level above the nominal voltage level of said radio battery.

46. The memory programming system according to claim 41, wherein said programming voltage is greater than the nominal voltage of said radio battery.

47. The memory programming system according to claim 46, wherein said substitute voltage providing means includes means for measuring the current drain of said portable radio before said substitute voltage is raised to its final programming voltage level.

48. The memory programming system according to claim 41, wherein said portable radio includes:

means for reading said program data from said radio memory to provide serial verification data; and wherein said external programming apparatus includes means for providing a visual indication of said serial verification data; and 49. The memory programming system according to claim 41, wherein said portable radio includes:

means for reading said program data from said radio memory to provide serial verification data;

means for modulating said programming signal with said serial verification data; and wherein said external programming apparatus includes means for demodulating said programming signal to provide said serial verification data;

means for displaying said serial verification data to provide a visual indication of the contents of said radio memory.

50. The memory programming system according to claim 49, wherein said modulating means includes means for current modulating said programming signal.

51. The memory programming system according to claim 49, wherein said current modulating means varies the DC current drain of said programming signal in digital steps at a rate corresponding to said serial verification data.

* * * * *